United States Patent [19]

Millot et al.

[11] Patent Number: 4,731,698

[45] Date of Patent: Mar. 15, 1988

[54] MECHANICAL AND ELECTRICAL ASSEMBLING DEVICE FOR HIGH-DENSITY ELECTRONIC CARDS WITH THERMAL CONDUCTION COOLING

[75] Inventors: François Millot, Asnieres; Jean C. Krau, Ygny, both of France

[73] Assignee: Sintra, Asnieres, France

[21] Appl. No.: 743,610

[22] Filed: Jun. 11, 1985

[30] Foreign Application Priority Data

Jun. 14, 1984 [FR] France .............................. 84 09308

[51] Int. Cl.$^4$ .............................................. H05K 7/20
[52] U.S. Cl. .................... 361/386; 361/413; 439/485
[58] Field of Search .......................... 339/112 R, 383; 361/386–389, 413–415

[56] References Cited

U.S. PATENT DOCUMENTS

| | | | |
|---|---|---|---|
| 3,467,891 | 9/1969 | Mogle | 361/388 |
| 3,631,325 | 12/1971 | Wenz | 361/387 |
| 3,992,653 | 11/1976 | Richardson et al. | 361/388 |
| 4,214,292 | 7/1980 | Johnson | 361/386 |
| 4,454,566 | 6/1984 | Coyne | 361/386 |

FOREIGN PATENT DOCUMENTS

| | | | |
|---|---|---|---|
| 0915796 | 11/1972 | Canada | 361/388 |
| 0058759 | 9/1982 | European Pat. Off. | |
| 0068195 | 5/1983 | European Pat. Off. | |
| 2757811 | 7/1978 | Fed. Rep. of Germany | |
| 2292400 | 6/1976 | France | |
| 2477828 | 9/1981 | France | |
| 2471059 | 6/1982 | France | |
| 0731623 | 4/1980 | U.S.S.R. | 361/386 |

*Primary Examiner*—A. D. Pellinen
*Assistant Examiner*—Gregory D. Thompson
*Attorney, Agent, or Firm*—Oblon, Fisher, Spivak, McClelland & Maier

[57] ABSTRACT

A U shaped electrical assembly device is provided which employs a zero insertion force receptacle on the two parallel arms of the U. The bottom side of the U shaped receptacle has a heat exchanger back piece which uses a slot to receive a thermal conductor employed on the insertable electronic cards which are to be placed within the receptacle.

1 Claim, 5 Drawing Figures

FIG_1

FIG_2

FIG_3

FIG_4

MECHANICAL AND ELECTRICAL ASSEMBLING DEVICE FOR HIGH-DENSITY ELECTRONIC CARDS WITH THERMAL CONDUCTION COOLING

FIELD OF THE INVENTION

The present invention is directed to an electrical mechanical assembly for holding high-density electronic cards which has a high-density interconnection facility along with a cooling facility provided therein.

BACKGROUND OF THE INVENTION

Complex electronic and/or data processing subassemblies, having a multi-processor and multi-bus structure, and evolving, under difficult environmental conditions must fulfill a number of requirements; high temperature stability, good mechanical behaviour, and also high stability to electromagnetic disturbing fields.

Furthermore, for 16 or 32-bits multi-bus technology data sytems it is necessary to provide a sufficient number of connector pins or points on each card; approximately 400 connector pins is about the number required for these types of technologies.

Similarly, in order to minimize the number of cards, it is worthwhile to produce high-density integration cards. This is also necessary to provide as means for the exchange of heat and for the dissipation of this heat which is generated in the components.

There currently exist standards for the format or size of electronic cards. This standarization allows easy integration and maintenance, harmonizing of the requirements for the installation of the subassemblies, modularity ensuring interchangeability between the various subassemblies, and guarantees satisfactory climatic behaviour, both mechanical and electrical. By way of example, the SEC size or format (standardized electronic cards) is presently in use in certain military devices. This standard defines cards sizes of 123 mm×170 mm. This size is sufficiently small for bearing the mechanical stresses, such as vibrations, shaking and shocks. But in the conventional structure this type of card only comprises a connector plug of 96 pins, possibly extensible to 144 or 200 pins which is insufficient to meet the requirements of a 16 or 32 bit multi-bus structure.

Another format or size utilized for civil applications, for a 32 bit DLX calculator, for example, is the format known as "double Europe" in which the dimensions of the cards are 320 mm×320 mm. These cards comprise each four connectors of 96 pins, two on each of two parallel ridges. Cards having this format do not satisfy the requirements that exist in difficult environmental conditions, for example, those imposed by military systems.

Conventionally, the connector plugs of CEN (Cartes électroniques Normalisées) format electronic cards are connected through the intermediary of a connector called "socket or female connector", placed on a bracket, the cards sliding into slide-bars orthogonal at the bottom of the receptacle. Thus, the pins and the contacts are opposite one another once the card is positioned in the basket. Furthermore, the connector pins disposed on the opposite edge of the card, for double Europe format cards, are connected by the front face, the interconnecting with the outside environment being thereby achieved through the front face. The spacing of the connector pins in these 96 pin connectors is 2.54 mm, the standardized spacing of the cards in the basket being either 12.7 mm, or 7.62 mm. The heat dissipation is generally provided in the frame forming the mechanical skeleton of the card, the form of which is adapted to the power to be dissipated.

The known structures do not allow to overcome the problems indicated herein-above. In particular, they cannot be utilized on 32 bits technology with the number of connector pins approaching or exceeding 400, taking into account the severe environmental requirements and offering a high-density integration.

SUMMARY OF THE INVENTION

The present invention concerns a mechanical and electrical assembling device for high-integration electronic data cards that allows to overcome the problems in a conventional "small" format compatible with a mechanical integration in, a standard CEN box. It uses at this end connectors with high-density of plugs containing, for example with 200 pins, at zero insertion force, associated to locking means and a particular receptacle.

According to this invention, a mechanical and electrical assembling device for high-density electronic data cards comprises a U-shaped section monoblock receptacle in the bottom of which is provided at least one slot. The lateral walls of which have recesses each of which are capable of receiving at least one multicontact connector, the contacts of which are distributed along the length of the card insertion slot in the connector. The connector uses a zero insertion force socket which has a a locking-unlocking device, wherein this receptacle is intended for the connection to electronic cards having contact tracks spaced like connector contacts, on at least one face of the card and on two opposite sides and comprises a thermal connector on a third side placed, in locked position, in the corresponding slot at the bottom of the receptacle, which bottom forms a back-piece and heat exchanger.

BRIEF DESCRIPTION OF THE DRAWINGS

The invention will become more apparent and other objects, features and advantages become more apparent from reading the following description given with reference to the appended figures.

DESCRIPTION OF THE PREFERRED EMBODIMENT

Figure 1:
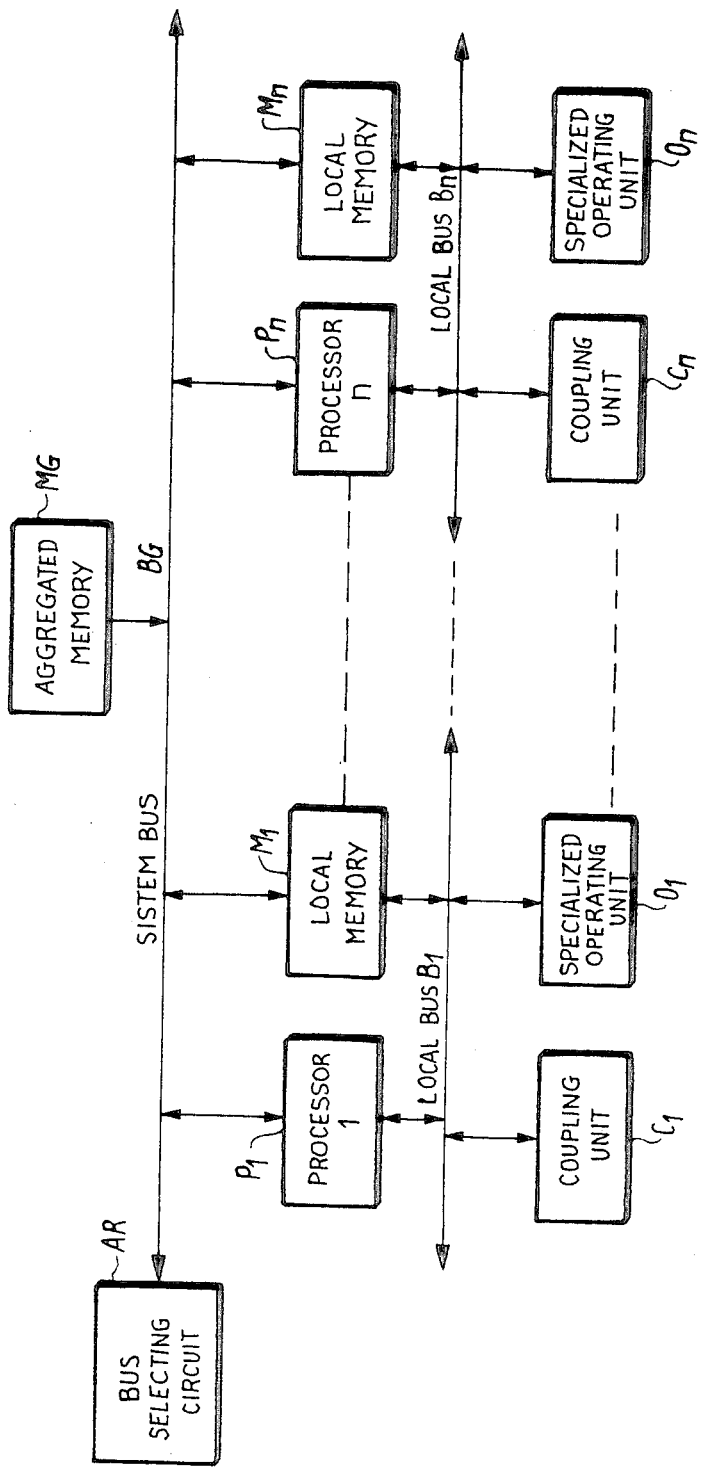
FIG. 1 is a block diagram of a multi-processor and multi-bus system to which applies, by way of example, the assembling device according to the invention.

FIG. 1 represents a multi-processor and multi-bus system, allowing to fully understand the interest of the assembling device according to the invention. This system comprises 16 or 32 bit processors, $P_1 \ldots P_n$ to which are associated local memories $M_1 \ldots M_n$. A certain number of coupling units $C_1 \ldots C_n$ are respectively associated to each of the processors $P_1 \ldots P_n$, as well as specialized operating units $O_1 \ldots O_n$. In a subassembly, index i,i=1 to n, processor $P_i$, memory $M_i$, coupling units $C_i$, and specialized operating units $O_i$ are interconnected through the intermediary of a local bus $B_i$ (such as local bus $B_1$ or $B_2$). Furthermore, these subassemblies are interconnected between one another through the intermediary of a system bus BG associated to an aggregated memory MG; a bus selecting circuit AR is provided in order to control the exchanges between the subassemblies. In such a system with 32 bit microprocessors, the system bus with power connections has to comprise about 200 pins; each central processor unit or local memory is connected to the system bus by about 100 pins. Similarly, the processors, local memories, coupling units or specialized operating units generally are connected through 100 pin assemblies, like the output-input units. Consequently, it is advantageous to provide adapted assembling systems, allowing the eventual integration of several functions on a single card with high-density package, the assembling system comprising about 400 connector pins to connect a card to the system bus as well as to the local buses of different subassemblies.

The mechanical and electrical assembling device according to the invention is constituted by a receptacle to which are associated mother cards with eventual protection means adapted to the interconnecting of pluggable electronic elements, or cards, the contact pins and thermal connectors of which are organized in a particular manner, as will be described herein-below.

Figure 2:
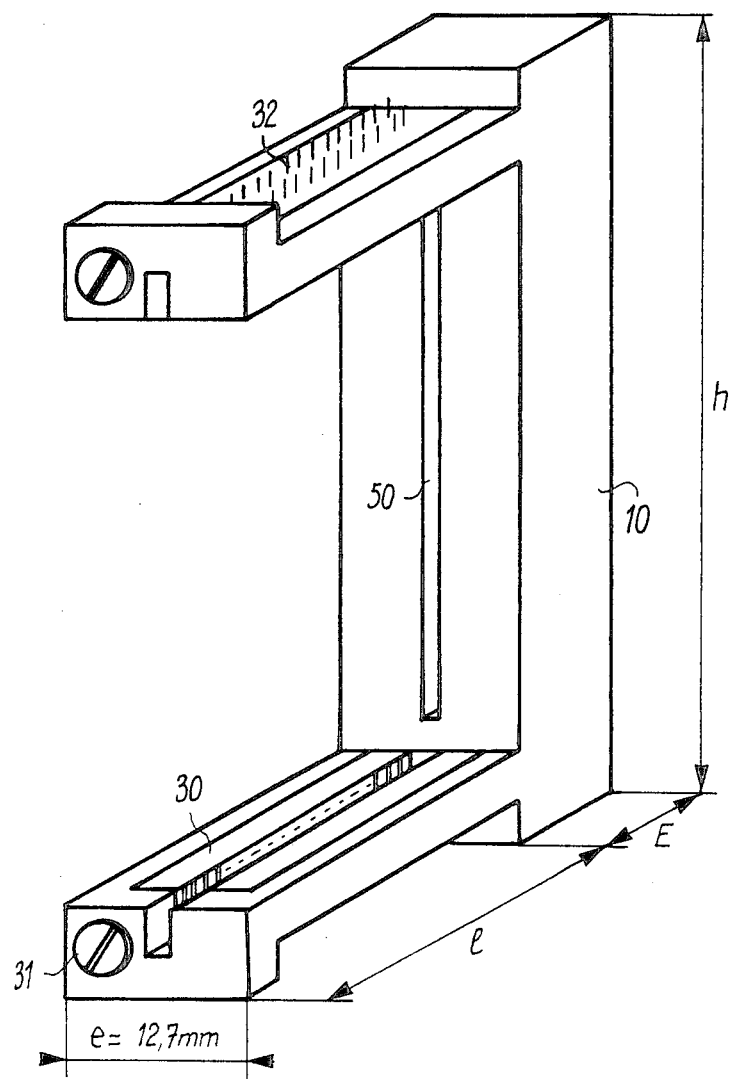
FIG. 2 is the drawing of an elementary receptacle of a device according to the invention.

An elementary receptacle of the electrical assembling device according to the invention is represented on FIG. 2. This receptacle 10 is intended to receive, maintain and interconnect, a pluggable electronic element, by means of two conventional type zero insertion force connectors 30 (only one is shown). This receptacle 10 is constituted by a U-shaped metallic piece, the dimensions of which, arms length l, bottom depth h and width e are adapted to the utilized standard. This receptacle is made from a light alloy, AG4 for example, through molding techniques such as sand, casing, lost wax or injection molding. Each arm of the U-shaped piece comprises a rectangular recess receiving a 200 contacts and zero insertion force connector 30. The slot of the connector 30 is extended up to the ends of the arms of the U-shaped piece so that the insertion of the pluggable electronic element is carried out by sliding in the slots, parallelly to the arms. A slot 50 is also provided in the bottom of the receptacle, and is intended to receive a thermal connector provided in the pluggable electronic element. The thickness E of the bottom of the U-shaped piece is sufficient for the recess to ensure the function of the thermal back-piece. In the compatible format of a mechanical integration in ½ ATR box, the dimensions of the cards are 123 mm×193 mm. In the compatible format of a mechanical integration in ¾ ATR box the dimensions of the cards are 190 mm×193 mm. The useful width at the level of the contacts, taken in the common dimensions at these two sizes, 193 Mm, is about 140 mm. In one embodiment of the invention, the zero insertion force connectors thus comprise 100 contacts on each side of the connector, spaced apart by 1.27 mm, opposite one another or alternate. On the other face of the connector, terminals 32 orthogonal to the connector are alternated at intervals of 1.27 mm. The terminals 32 are tin plated and of the type to be welded on a printed circuit.

Zero insertion force connectors 30 each comprise 200 contacts, as indicated herein-above at spaces of 1.27 mm apart, and operate in the following way: each connector has two positions for the contacts and is controlled by a locking-unlocking device 31. During insertion of the pluggable electronic element in the slots of the receptacle and of the connector, the connector is in open position, its contacts are retracted in the slots of the connector and therefore no effort is applied to the contacts track of the pluggable electronic element. When this element is correctly positioned, the locking-unlocking device 31 causes a connection by having the contacts protruding from their housings to to connect onto the corresponding tracks of the card-indexes of the card, also at an interval of 1.27 mm. The contacts are thus locked into this position. The passage from the open position to the closed position is carried out by a locking-unlocking system 31 accessible at the end of each arm of the receptacle through use of a suitable tooling.

Figure 3:
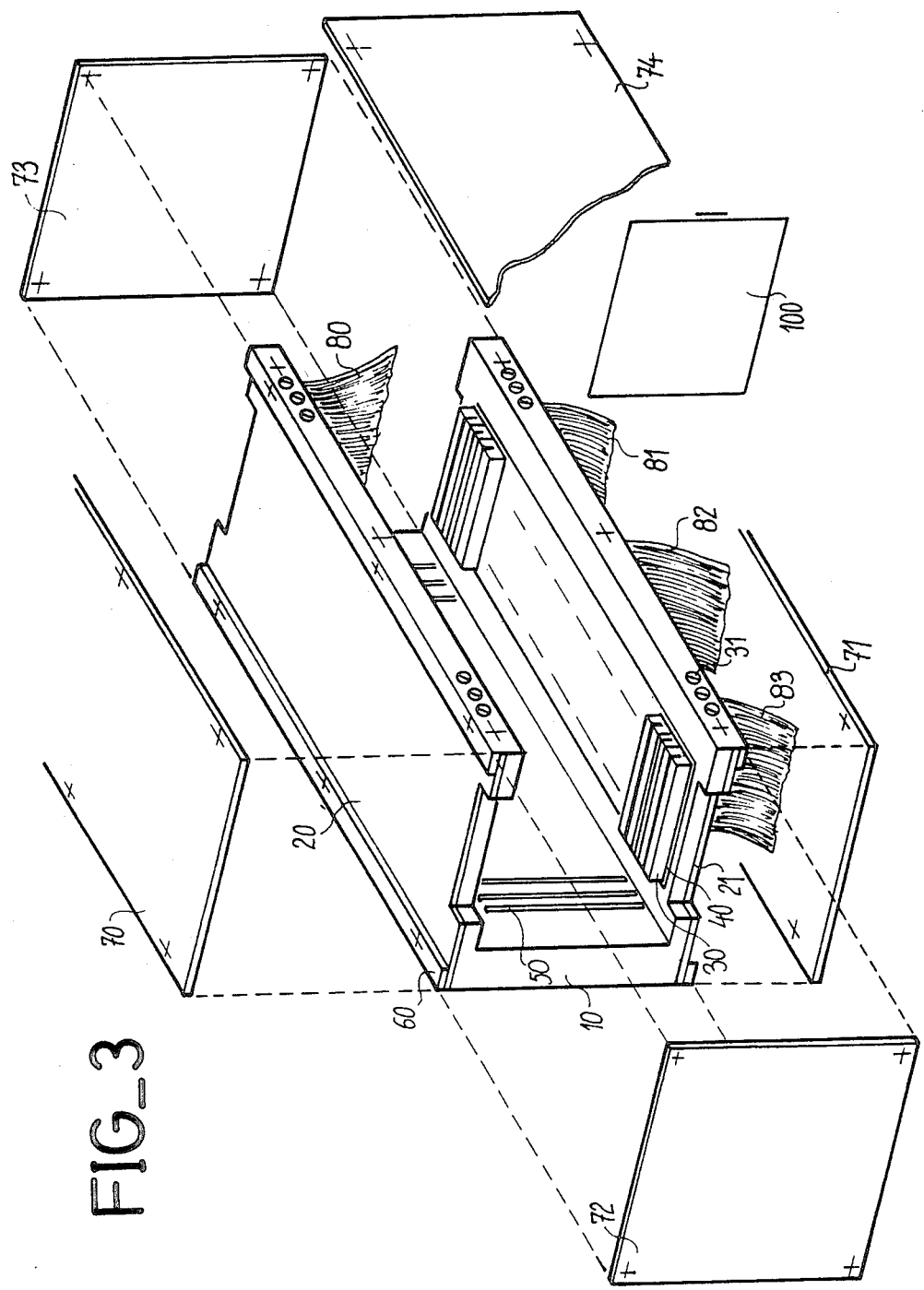
FIG. 3 is the drawing of a multi-card assembling device according to the invention.

FIG. 3 represents the assembling device system according to the invention, with a multi-card receptacle. In this figure the same elements as those of FIG. 2 have been designated by the same reference numerals. Receptacle 10 is intended to receive and interconnect an assembly of pluggable electronic elements or electronic cards by means of zero insertion force connectors 30. The receptacle 10 itself is constituted by a metallic section piece the section of which is U-shaped and the length of which is provided so as to receive a certain number of cards. Each lateral wall associated to an arm of the U-shaped piece is intended to receive 200 contacts and zero insertion force connectors, and, as described herein-above, the bottom part is reserved for the heat evacuation. The walls corresponding to arms of the U-shaped piece are recessed out so that each receives a group of connectors. These connectors can be interconnected by means of a wiring circuit for each lateral wall, for example a mother card, 20 and 21 respectively, previously wave welded to these connectors. These mother cards 20 and 21 are printed circuits allowing to obtain directly interconnections between cards disposed in a single multi-card receptacle. In a preferred embodiment of the invention, the spacing between the cards provided being the standardized spacing of 12.7 mm and the width of the connections also being close to 12.7 mm, the recess 40 of the receptacle for positioning the connectors welded to the mother card 20 and 21 is machined in a single operation along the whole length of the receptacle, thereby preventing tolerances accumulation as to the positioning. In the embodiment represented, connectors 30 extend beyond the receptacle and their insertion slot is thus accessible inside the U-shape; without it being necessary to provide a slot in receptacle 10. The bottom of the metallic section piece forming the receptacle 10 comprises slots 50 spaced 12.7 mm apart, in which can be inserted thermal connectors provided on one of the edges of the electronic cards. Power strenghtening bars 60 can be provided and welded onto the face of the mother card opposite that bearing the connectors and along the whole length of the section piece. The receptacle is provided with a locking-unlocking device 31 formed of a locking-unlocking element associated to each connector 30, and disposed along the length of the receptacle.

This receptacle 10 that forms the skeleton of the assembling device according to the invention can be completed by a housing that allows to protect the mother cards as well as the daughter cards plugged into the receptacle. To do this, metallic protection covers 70 and 71 are provided for the two mother cards bearing the connectors. They are fixed to the receptacle 10 through the intermediary of strengthening bars 60 and the edges of the mother cards. These covers can be rendered hermetic. The ends of the U-shaped section piece receptacle can be sealed in the case of utilization in opening by flanges, or in the case of direct utilization by panels 72 and 73 in FIG. 3, for example, one being possibly provided with an operational desk applied to one of the ends and the other bearing the external interconnecting points to the other end.

The face of the receptacle left free for the introduction of the cards is sealed by a plate 74 which rests on back-pieces provided on the fourth side of the cards (not shown) to ensure supplementary heat conduction towards the outside.

Such a structure allows to provide that all the power connections and system bus connections will be provided on one of the lateral walls of the U-shaped receptacle, the system bus outlet being ensured, for example, in such a connecting device by means of a high-density connector unit of the upper mother cards reserved for this purpose, in which no electronic card is plugged and to which is connected a shielded flat connector 80. Furthermore, on the opposite face, the connection between the different connectors is obtained directly via the mother card 21 in a printed circuit for the interconnection between cards borne by a single receptacle. Shielded flat connectors 81, 82, 83, for example can be provided and connected to certain high-density connectors in order to produce input/output connections.

Due to the structure of the receptacle, and the fact that the thermal dissipation is ensured by a thermal connector connected to the bottom of the U-shaped piece, several cooling methods can be utilized: the backpiece of the receptacle, i.e. the bottom of the U-shape, receiving the thermal connectors of the cards is the natural thermal radiator in this technology. The heat exchange can be ensured at this level either by natural convection, or by conduction (the back-piece of the receptacle being fixed onto a heat exchanger, or a caleoduc, or a Peltier effect exchanger, etc. . . . ) either by forced convection, the back piece being able to be shaped so as to allow the passage of a forced ventilation. The upper mother card, associated to the system bus can also allow, as indicated above, to distribute the supply on the connectors of the upper part. This aggregated mother card, can be produced by a multi-layer printed circuit. The possible connection of this bus towards the outside is provided by metallized holes at the end of the cards allowing the connection of a printed sheet. The local bus mother cards are adapted to each application.

Figure 4:
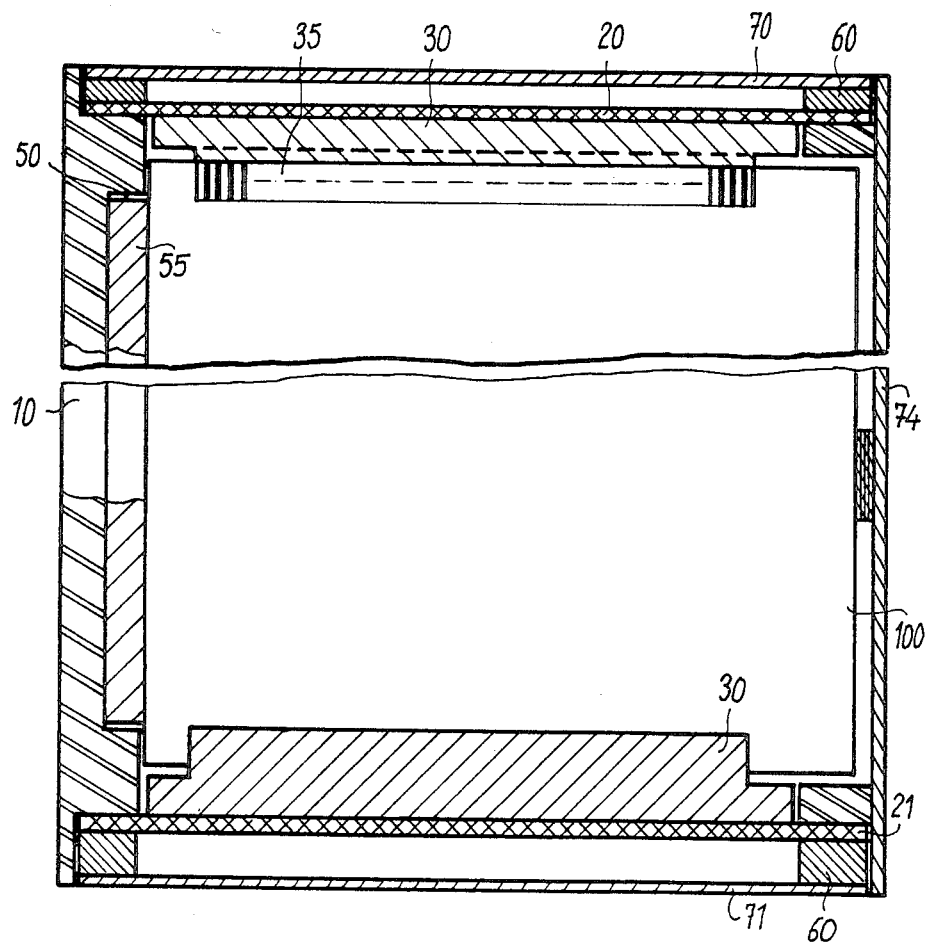
FIG. 4 is the drawing of a card adapted to the assembling device according to the invention.
Figure 5:
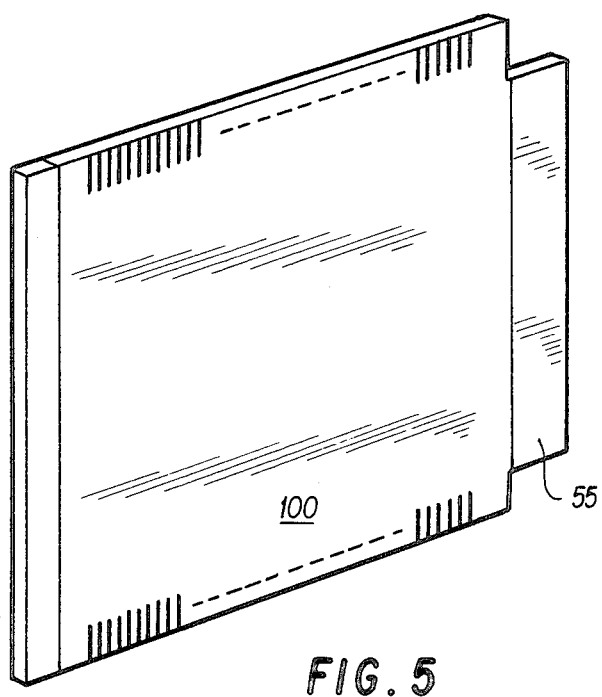
FIG. 5 is a different view of the embodiment of FIG. 4.

FIG. 4 represents in section the mechanical and electrical assembling device according to the invention in which has been inserted an electronic printed card 100 comprising a useful central zone, a thermal connector 55 for insertion in a slot 50 of the back-piece of the receptacle, two index-cards sandwiched together each of 200 pins, each located in two zones 35 of the card 100 situated on two opposite sides and constituting the guiding zone; connecting tracks and deposited by photoengraving, at intervals of 1.27 mm. The two lateral walls of the device are symmetrical but the connector 30 is represented in the bottom part of the FIG. 4 and the card part with its contact tracks in the zones 35 is represented in the top of the figure. FIG. 5 is a different view of the card shown in FIG. 4.

A supplementary back-piece is disposed on the fourth side of the card. As indicated herein-above, in format compatible with a ½ ATR box mechanical integration, the overall dimensions of the card can be 80 mm×190 mm. This card size or format allows installation per face of 30 conventional boxes having 14 or 16 pins, or 60 "chip carrier" type boxes, or again 100 to 120 hybrid chips. In compatible format with a ¾ ATR box mechanical integration, i.e. 145 mm×190 mm; such a card allows the installation per face of 60 conventional boxes with 14 to 16 pins, or 120 boxes of the chip carrier type. This format also allows the installation of hybrid chips by means of adapted supports. The dissipated powers envisaged can be about 20 watt for a ceramic substrate, 15 watt for a colaminate substrate, or 10 watt for an epoxy-glass substrate.

The present invention is not limited to the embodiments described and represented herein-above. In particular, the value for the connector intervals, 1.27 mm has been selected as half of the normal interval 2.54 mm. But this value is not limitative and similar values allowing to maintain the same order of magnitude for the number of connector pins could also be chosen. Similarly, the number of connector pins 400, is not limitative. It has been indicated in order to keep some supplementary connector pins further to the pins necessary in a 32 bit system. Furthermore, the connectors described, having contacts on either side of the insertion slot are adapted to double face cards. But the connectors adapted to simple face cards, comprising contacts on a single side of the insertion slot can also be utilized.

On the other hand, the thermal connector can also be utilized in order to increase, beyond 400 pins, the connecting capacity of an electronic card (for example, power bus, electrical and mechanical masses, etc. . . . ).

Furthermore, the mechanical and electrical assembling device has been described herein-above as comprising as many connectors as can be contained by the recess provided in the lateral walls of the receptacle. In practice, this arrangement can be adapted to the application configuration, and certain of the connectors provided at the elementary spacing can be suppressed, for example, when a subassembly is wired in double thickness and occupies two elementary spaces. It would also be possible in order to fully maintain mechanically a subassembly comprising two cards to provide a connector in which the electrical contacts would non longer be utilized.

The mechanical and electrical assembling device according to the invention that simultaneously ensures the mechanical stability and the electrical connections, is particularly well adapted, due to the possibility of physical separation of the wiring between the system bus and the local buses, and due to the large possibilities of extension by common wiring.

This assembling device can welcome all types of single- or double-face cards: conventional cards with standard components, "chip carrier" cards; hybrid circuit cards; or cards utilizing components issuing from different technologies.

We claim:

1. A device for holding high-density electronic data cards comprising:
   a U-shaped receptacle having two legs and a bottom portion, said receptacle having a means providing thermal conduction cooling path with a received electronic card on the bottom portion thereof;
   zero insertion force receiving means on each of the legs of said U-shaped receptacle positioned such that said electronic card is inserted into said U-shaped receptacle when said zero insertion force receiving means are in a unlocked position.

* * * * *